United States Patent
Lee et al.

(10) Patent No.: US 6,420,221 B1
(45) Date of Patent: Jul. 16, 2002

(54) METHOD OF MANUFACTURING A HIGHLY LATCHUP-IMMUNE CMOS I/O STRUCTURE

(75) Inventors: Jian-Hsing Lee; Jiaw-Ren Shih; Shui-hung Chen; Ping-Lung Liao, all of Hsin-chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/507,646

(22) Filed: Feb. 22, 2000

(51) Int. Cl.$^7$ .......................................... H01L 21/8238
(52) U.S. Cl. ...................... 438/199; 438/202; 257/372; 257/398; 365/181
(58) Field of Search .................................. 438/199, 202, 438/205, 223–228, 220, 309

(56) References Cited

U.S. PATENT DOCUMENTS

| | | | |
|---|---|---|---|
| 5,023,689 A | | 6/1991 | Sugawara .................... 357/42 |
| 5,083,179 A | * | 1/1992 | Chong et al. ................. 357/42 |
| 5,306,939 A | * | 4/1994 | Mitani et al. ............... 257/372 |
| 5,406,513 A | | 4/1995 | Camaris et al. ............. 365/181 |
| 5,895,940 A | | 4/1999 | Kim .......................... 257/173 |

OTHER PUBLICATIONS

S. Wolf, "Silicon Processing for the VLSI Era," vol. 2, Lattice Press, (1990), 6.4 Latchup in CMOS, pp. 400–419.

* cited by examiner

Primary Examiner—Hoai V. Ho
Assistant Examiner—Dung A Le
(74) Attorney, Agent, or Firm—George O. Saile; Stephen B. Ackerman

(57) ABSTRACT

CMOS I/O structures are described which are latchup-immune by inserting p+ and n+ diffusion guard-rings into the NMOS and PMOS source side of a semiconductor substrate, respectively. P+ diffusion guard-rings surround individual n-channel transistors and n+ diffusion guard-rings surround individual p-channel transistors. These guard-rings, connected to voltage supplies, reduce the shunt resistances of the parasitic SCRs, commonly associated with CMOS structures, from either the p-substrate to p+ guard-ring or the n-well to n+ guard-ring. In a second preferred embodiment a deep p+ implant is implanted into the p+ guard-ring or p-well pickup to decrease the shunt resistances of the parasitic SCRs. The n+ and p+ guard-rings, like the guard-rings of the first preferred embodiment, are connected to positive and negative voltage supplies, respectively. In either of the two preferred embodiments the reduced shunt resistances prevent the forward biasing of the parasitic bipolar transistors of the SCR, thus insuring that the holding voltage is larger than the supply voltage.

6 Claims, 7 Drawing Sheets

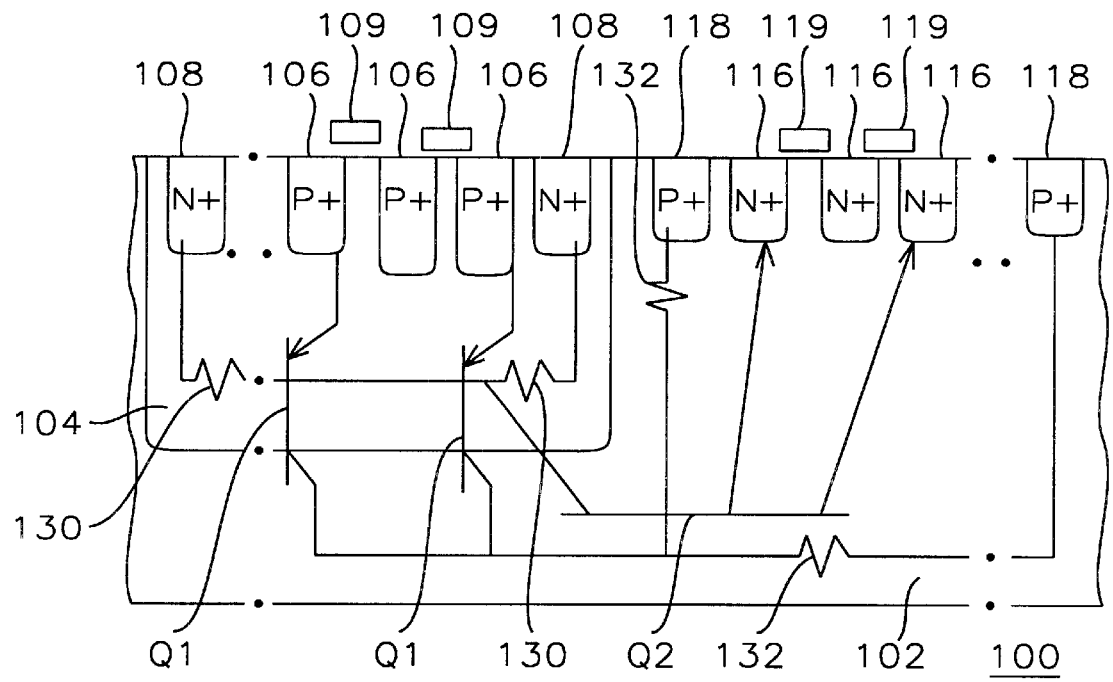
FIG. 1 – Prior Art
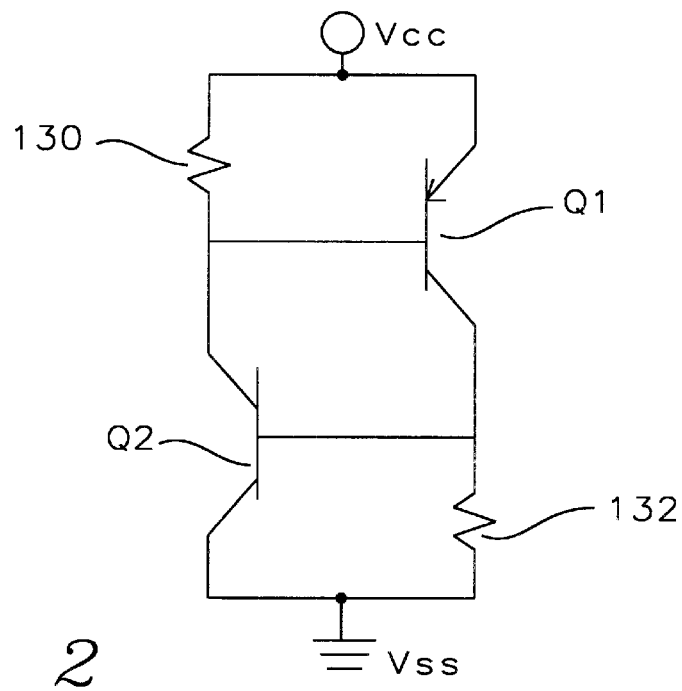
FIG. 2

METHOD OF MANUFACTURING A HIGHLY LATCHUP-IMMUNE CMOS I/O STRUCTURE

BACKGROUND OF THE INVENTION

1. Field of the Invention

The invention relates to structures and methods of fabricating integrated CMOS circuits, and more particularly to making those CMOS circuits highly immune to latchup.

2. Description of the Related Art

Latchup is a phenomenon of CMOS circuits well known to circuit designers and is described by S. Wolf in *Silicon Processing for the VLSI Era*, Volume 2, by Lattice Press, copyright 1990, 6.4 LATCHUP IN CMOS. The inherent and self-destructive latchup effect in CMOS circuits which has always been a major problem has become even more so a problem as device dimension continue to shrink. The latchup phenomenon creates a low resistance path between the positive and negative voltage supplies of a CMOS circuit and enables the flow of large currents through the affected circuit. When latchup occurs the circuit stops functioning and may even get destroyed because of the heat developed by the large currents.

Latchup is caused by the presence of parasitic bipolar pnp and npn transistors in the structure of PMOS and NMOS transistors. The closer those complementary MOS transistors are to each other the more there is a likelihood of those parasitic transistors to interact electrically to form a pnpn diode, equal to a silicon controlled rectifier (SCR). Internal voltages across the anode and cathode of that SCR which exceed a breakover voltage cause the SCR to reach a low impedance state with the possibility of a resultant high current. This state can be maintained indefinitely if an external circuit can supply a necessary holding current, i.e., the SCR stays latched up and the circuit cannot recover.

FIG. 1 shows a cross-sectional view of a prior art CMOS device layout 100. Embedded in a p-substrate 102 is an n-well 104 containing a plurality of p+ regions 106 which are both source and drain. An n+ guard-ring 108 located at the perimeter of the n-well surrounds regions 106. Similarly, a plurality of n+ regions 116, of both source and drain, are formed in the p-substrate 102 and are surrounded by a p+ guard-ring 118. Gates 109 and 119 are indicated straddling sources and drains of regions 106 and 116, respectively. The parasitic SCR inherent in CMOS structures is comprised of transistor Q1 and Q2. Q1 is a vertical bipolar pnp parasitic transistor structure and Q2 is a lateral bipolar npn parasitic transistor structure resulting from the arrangement of the PMOS transistors of regions 106 and of the NMOS transistor of regions 116. The emitter of Q1 comprises the sources of regions 106, the base comprises n-well 104 and the collector comprises p-substrate 102. Analogous the emitter of Q2 comprises the sources of regions 116, the base comprises p-substrate 102 and the collector comprises n-well 104. Between guard-ring 108 and the base of Q1 is the bulk n-well resistance 130. Between guard-ring 118 and the base of Q2 is the bulk p-substrate resistance 132. Bulk resistances 130 and 132 each have a value of about 100 Ohms.

FIG. 2 is an equivalent circuit diagram of the parasitic transistors of FIG. 1 and represents the above mentioned pnpn diode or SCR. One terminal of resistor 130 (equal to guard-ring 108) and the emitter of Q1 (equal to the source of region 108) is connected to a positive voltage $V_{cc}$. One terminal of resistor 132 (equal to guard-ring 118) and the emitter of Q2 (equal to the source of region 116) is connected to a negative voltage $V_{ss}$, typically ground.

The above described arrangement for I/O devices with guard ring structures is latchup free as long as NMOS and PMOS transistors are 15 micron or more apart. At distances below 15 micron these structures start exhibiting latchup. Another way to avoid latchup is to use EPI wafers to reduce the resistivity of the substrate resistor with a resultant higher cost.

Attempts by device designers to overcome the latchup problem are legions and of a great variety, each providing solutions applicable to the then current technological restraints and requirements. As circuit dimensions continue to shrink new device structures become necessary. The inventions described subsequently address and solve the latchup problem.

The following three U.S. Patents may be considered relating to the present invention:

U.S. Pat. No. 5,023,689 (Sugawara) illustrates a complementary integrated circuit device having a guard ring region surrounding a region having transistors that are larger than those in a second region do. The guard ring region is supplied with a power voltage via a conductor line, which is formed separately from a conductor line supplying the power voltage to each of the larger transistors.

U.S. Pat. No. 5,406,513 (Canaris et al.) shows a CMOS circuit formed in a semiconductor substrate having improved immunity to radiation induced latch-up and improved immunity to a single event upset. A continuous P+ guard ring is formed surrounding the n-channel transistors and between the n-channel transistors and an N-Well. Similarly, a continuous N+guard ring is formed surrounding the p-channel transistors and between a p-channel transistors and the p-type substrate. In the event of a radiation hit, the guard rings operate to reduce the parasitic impedance in the collector circuits of the parasitic bipolar transistors forming a parasitic SCR and also act as additional collectors of radiation induced current.

U.S. Pat. No. 5,895,940 (Kim) describes integrated circuits having built-in electrostatic discharge protection thyristors. Guard rings are formed in a first well region and a second well region to complete the structures of a pair of thyristors. The guard rings are preferably electrically connected to reference potentials so that damage caused by excessive voltage can be inhibited upon latch-up of the built-in thyristors.

It should be noted that none of the above-cited examples of the related art reduce sufficiently the n-well or p-substrate resistance at decreased circuit dimensions or reduced NMOS-to-PMOS spacings to avoid latchup.

SUMMARY OF THE INVENTION

It is an object of the present invention to provide new CMOS I/O structures and methods which improve their latchup immunity.

Another object of the present invention is to decrease the spacing between the NMOS and PMOS devices to 5 micron while maintaining improved latchup immunity.

These objects have been achieved in a first preferred embodiment by inserting p+ and n+ diffusion guard-rings into the NMOS and PMOS source side of a semiconductor substrate, respectively. P+ diffusion guard-rings surround individual n-channel transistors and n+ diffusion guard-rings surround individual p-channel transistors. These guard-rings, connected to voltage supplies, reduce the shunt resistances of the parasitic SCRs, commonly associated with CMOS structures, from either the p-substrate to p+ guard-ring or the n-well to n+ guard-ring.

In a second preferred embodiment of the present invention a deep p+ implant is implanted into the p+ guard-ring or p-well pickup to decrease the shunt resistances of the parasitic SCRs.

The n+ and p+ guard-rings, like the guard-rings of the first preferred embodiment, are connected to positive and negative voltage supplies, respectively. In either of the two preferred embodiments the shunt resistances are reduced to less than 3 Ohms, thereby preventing the forward biasing of the parasitic bipolar transistors of the SCR.

BRIEF DESCRIPTION OF THE DRAWINGS

FIG. 1 is a cross sectional view of a CMOS structure of the prior art with parasitic transistors shown schematically.

FIG. 2 is an equivalent circuit diagram of the parasitic transistors and resistors of FIG. 1.

DESCRIPTION OF THE PREFERRED EMBODIMENT

Figure 3:
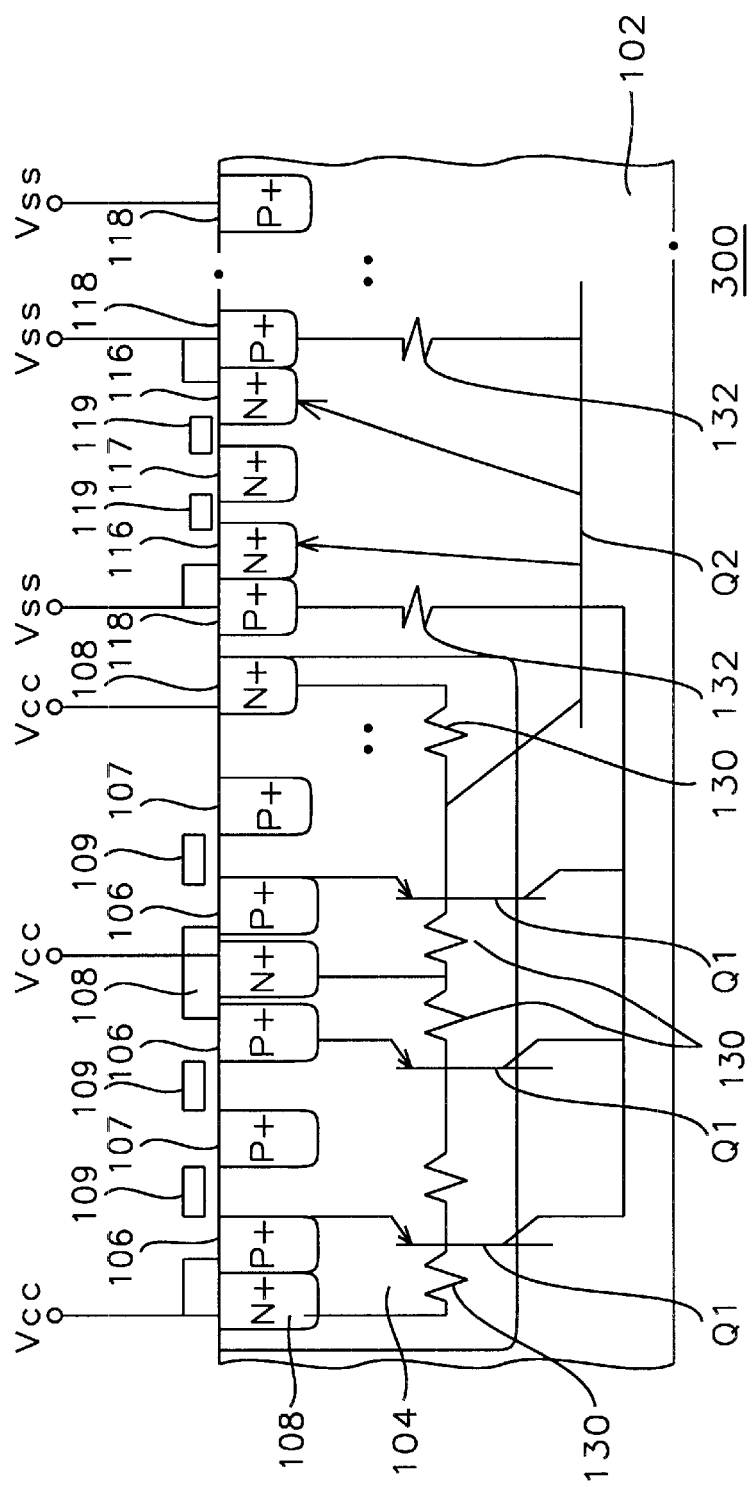
FIG. 3 is a cross sectional view of a CMOS structure of a first preferred embodiment of the present invention with parasitic transistors shown schematically.

We now proceed with the description of a first preferred embodiment of the present invention by directing attention to FIG. 3. FIG. 3 shows a cross-sectional view of CMOS device layout 300. Embedded in a p-substrate 102 of a semiconductor wafer is an n-well 104 containing p+ source regions 106 and p+ drain regions 107. N+ guard-rings 108 surround individual regions 106 and 107, where regions 106 and 107 make up one or more p-channel transistors. N+ guard rings 108 and p+ source regions 106 are tied to a voltage supply $V_{cc}$. Similarly, n+ source regions 116 and n+ drain regions 117 are formed in the p-substrate 102. P+ guard rings 118 surround individual regions 116 and 117, where regions 116 and 117 make up one or more n-channel transistors. P+ guard rings 118 and n+ source regions 116 are tied to voltage supply $V_{ss}$ which is more negative than $V_{cc}$. Gates 109 are indicated straddling regions 106 and 107.

Gates 119 similarly straddle regions 116 and 117. Q1 is a vertical bipolar pnp parasitic transistor structure and Q2 is a lateral bipolar npn parasitic transistor structure resulting from the arrangement of the PMOS transistors of regions 106 and 107, and of the NMOS transistor of regions 116 and 117. The emitter of Q1 comprises the sources of regions 106, the base comprises n-well 104 and the collector comprises p-substrate 102. Analogous the emitter of Q2 comprises the sources of regions 116, the base comprises p-substrate 102 and the collector comprises n-well 104. Between guard-rings 108 and the base of Q1 are the bulk n-well resistances 130 which are parallel and therefore reduce the total n-well resistance. Between guard-rings 118 and the base of Q2 is the bulk p-substrate resistance 132.

The pattern of guard-ring 108 enclosing regions 106, 107, 106, and of guard-ring 118 enclosing regions 116, 117, 116 keeps repeating as indicated by dots in n-well 104 and in p-substrate 102 in FIG. 3.

Figure 4:
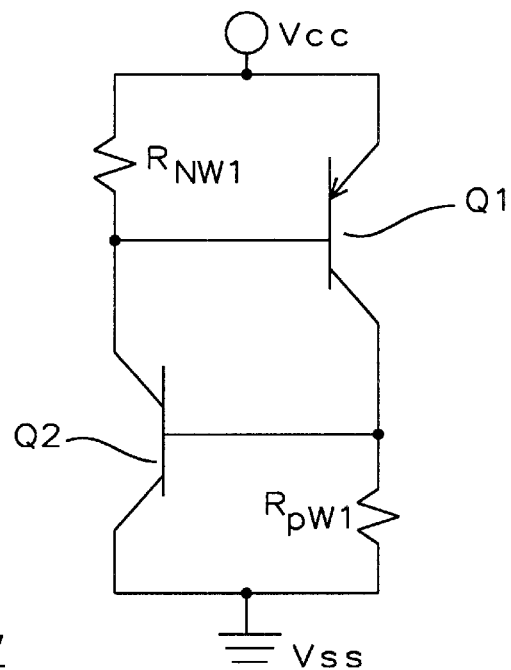
FIG. 4 is an equivalent circuit diagram of the parasitic transistors and of the reduced parasitic resistances of FIG. 3 and FIG. 5.

The deep p+ implant may also be implanted into the p-well pick-up and the p+ guard-rings and the n+ regions may be located in a p-well of the p-substrate. When bulk n-well resistances 130 are combined into resistance $R_{nW1}$, and when bulk p-substrate resistances 132 are combined into resistance $R_{pW1}$ they each typically measure from 1 to 2 Ohms but may range from 0.5 to 10 Ohms. Refer to FIG. 4 for resistances $R_{nW1}$ and $R_{pW1}$.

FIG. 4 is an equivalent circuit diagram of the parasitic transistors of FIG. 3. FIG. 4 is similar to that of FIG. 2, except that the FIG. 4 well or substrate resistors $R_{nW1}$, and $R_{nP1}$ represent a lower resistance and thus prevent latchup. It is understood that components shown in the figures which are similar are identified by the same reference numbers.

Figure 5:
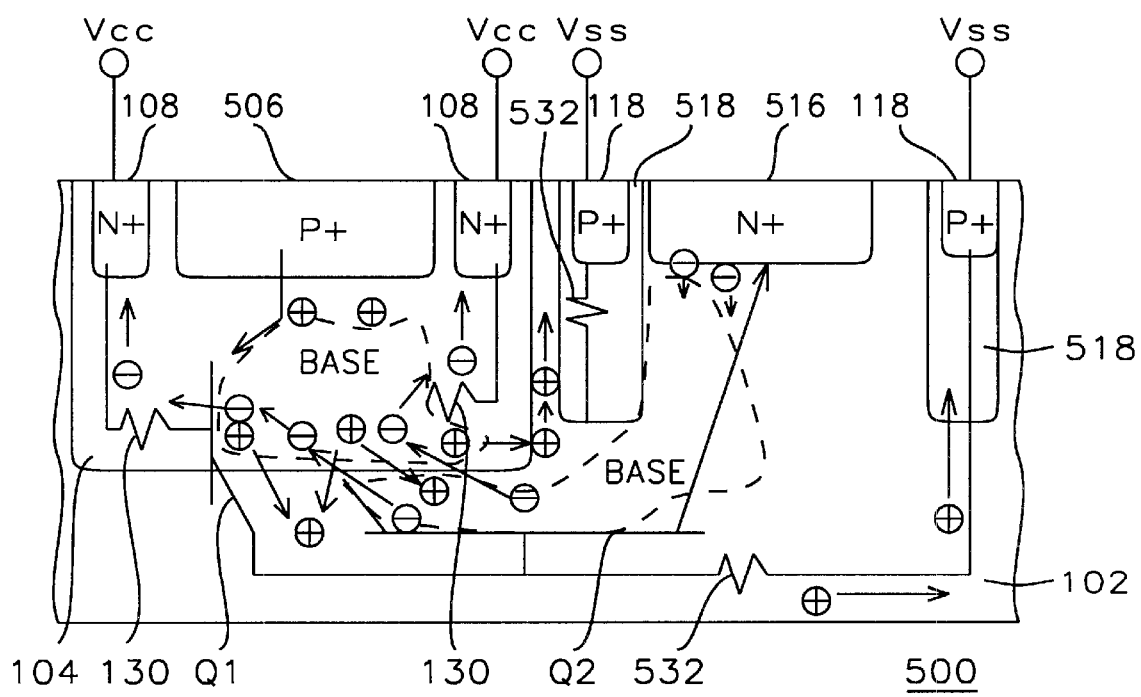
FIG. 5 is a cross sectional view of a CMOS structure of a second preferred embodiment of the present invention with parasitic transistors shown schematically.

In a second preferred embodiment of the present invention, as illustrated in FIG. 5, the shunt resistance is reduced by adding a deep p+ implant to the p+ guard-ring. FIG. 5 shows a cross-sectional view of CMOS device layout 500. Embedded in a p-substrate 102 of a semiconductor wafer is an n-well 104 containing p+ region 506 which is comprised of sources and drains (not shown) and which make up p-channel transistors. An n+ guard-ring 108 diffused at the inside perimeter of n-well 104 surrounds region 506. N+ guard ring 108 is tied to a voltage supply $V_{cc}$, as are the sources within region 506 (not shown). An n+ region 516 is formed in the p-substrate 102. Region 516 also comprises sources and drains (not shown) which make up n-channel transistors. A p+ guard ring 118, diffused into p-substrate 102, surround region 516. P+ guard ring 118 is tied to voltage supply $V_{ss}$, which is more negative than voltage supply $V_{cc}$. A deep p+ implant 518 is implanted into the p+ guard-ring 118 to decrease the shunt resistance of the parasitic SCR (comprising transistors Q1 and Q2). Q1 is a vertical bipolar pnp parasitic transistor structure and Q2 is a lateral bipolar npn parasitic transistor structure resulting from the arrangement of the PMOS transistors of region 506, and of the NMOS transistor of region 516. The emitter of Q1 comprises the sources of region 506, the base comprises n-well 104 and the collector comprises p-substrate 102. In a similar manner, the emitter of Q2 comprises the sources of region 116, the base comprises p-substrate 102 and the collector comprises n-well 104. Between guard-ring 108 and the base of Q1 are bulk n-well resistors 130 which are paralleled and, therefore, reduce the total n-well resistance. Between guard-ring 118 and the base of Q2 are the shunt resistances 532 of p+ implant 518. Because of the deep ion implant 518, these shunt resistances are of a much lower value than the shunt resistances of the prior art. The shunt resistance 532 is typically 1 to 2 Ohms but may range from 0.5 to 10 Ohms. The deep p+ implant may also be implanted into the p-well pick-up and the p+ guard-rings and the n+ regions may be located in a p-well of the p-substrate.

FIG. 4 also serves as an equivalent circuit diagram of the parasitic transistors of FIG. 5 since the value of the shunt resistances of both the first and second preferred embodiment of the present invention are the same. In FIG. 4, resistor $R_{nW1}$, represents the sum of all paralleled resistors 130, and resistor $R_{nP1}$ represents shunt resistance 532.

Figure 6:
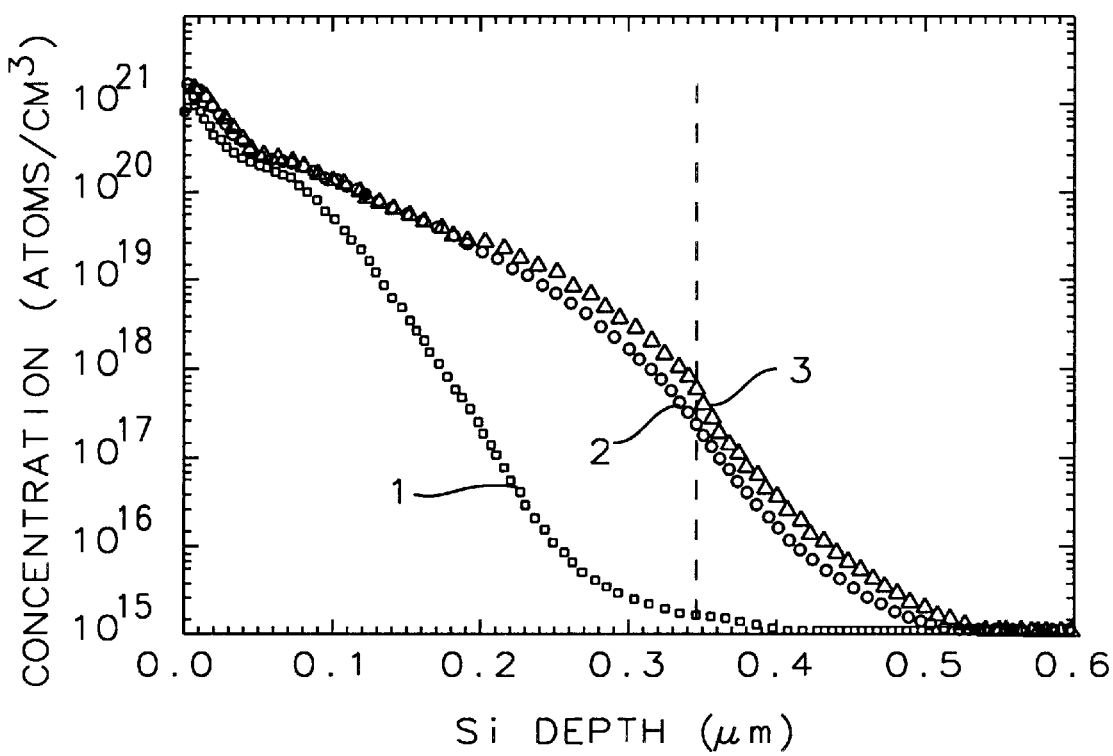
FIG. 6 is a graph of the deep p+ boron concentration of the guard-ring for the CMOS structure of FIG. 5.

FIG. 6 is a graph of the boron implant concentration in atoms/cm$^3$ as a function of the depth in the silicon up to 0.6 microns ($\mu$m). Curve 1 shows the boron concentration for deep p+ implants with an energy of 6 keV and a boron dose of 3.5×10$^{15}$. Curve 2 shows the boron concentration for deep p+ implants with an energy of 6 keV and a boron dose of 3.5×10$^{15}$ followed by a second implant at 20 keV and a boron dose of 2×10$^{15}$. Curve 3 shows the boron concentration for deep p+ implants with an energy of 6 keV and a boron dose of 3.5×101$^{15}$ followed by a second implant at 25 keV and a boron dose of 2×10$^{15}$. It can be seen that the boron concentration after the second implant is raised significantly ranging from 10$^{21}$ atoms/cm$^3$ to about 3×10$^{17}$ atoms/cm$^3$ (Curve 2) and to about 6×10$^{17}$ atoms/cm$^3$ (Curve 3) from the silicon surface down to 0.35 $\mu$m.

Figure 7:
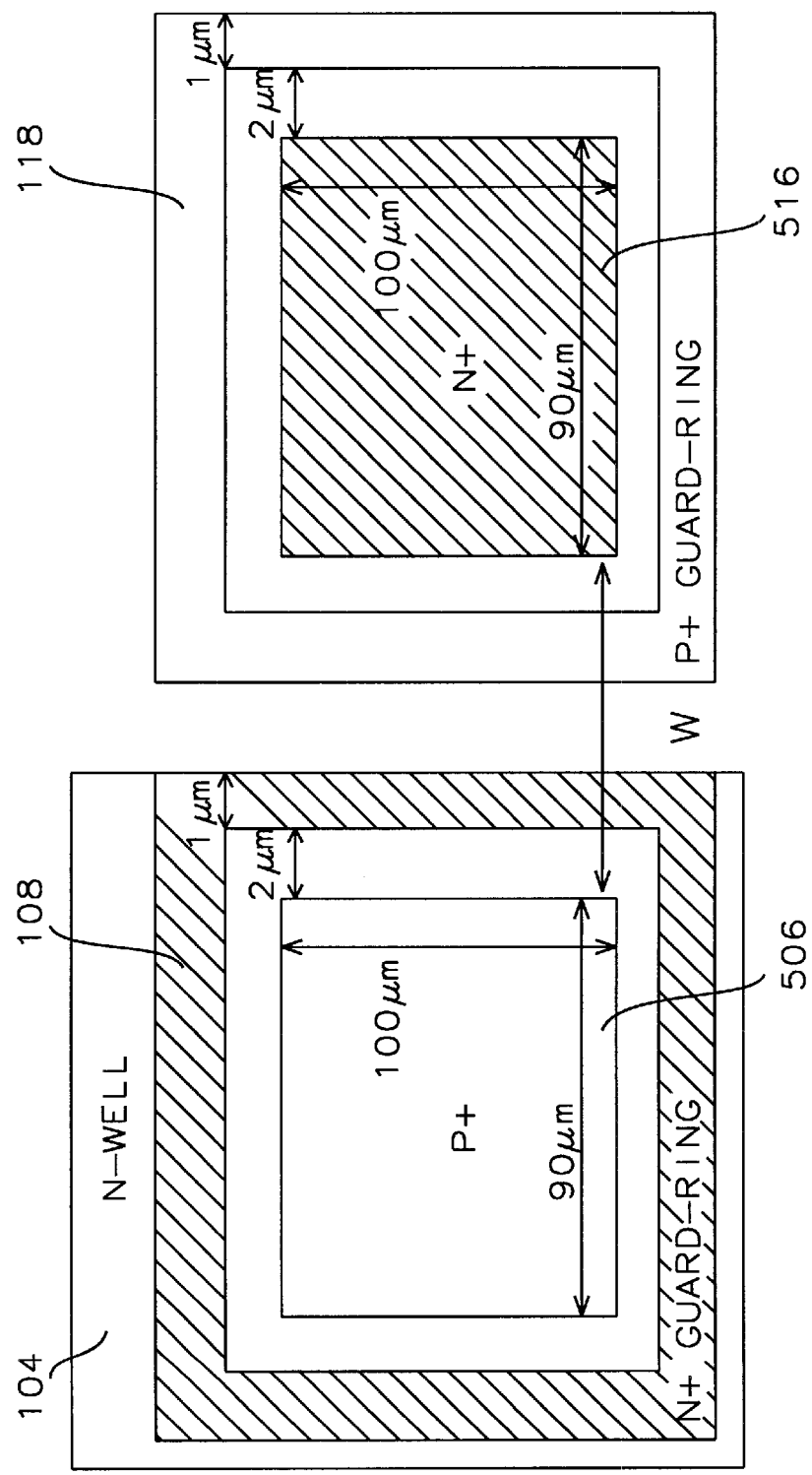
FIG. 7 is a top view layout of the CMOS structure of FIG. 5.

FIG. 7 is a top view of the cross-section of FIG. 5 showing n-well 104 and embedded in it a one micron wide n+ guard-ring 108. The n+ guard-ring is separated from the p+ region 506 by 2 microns all around. The p+ region itself is about 100 by 90 micron. The same dimensions apply to the p+ guard-ring 118 and the n+ region 516. W indicates the distance between p+ region 506 and n+ region 516. Varying W also changes the holding voltage. This is demonstrated by the results of an I/O test pattern comparing the latchup susceptibility of the related art with that of both the first and second preferred embodiment of the present invention, where the distance W was varied and the holding voltage determined. These results are summarized in Table 1.

TABLE 1

| W (spacing) | 5 micron | 10 micron | 15 micron |
|---|---|---|---|
| hold. volt. related art | 1.86 v | 2.1 v | no latchup |
| hold. volt. invention | no latchup | no latchup | no latchup |

Table 1 shows that the condition of "no latchup" occurs in the related art only when the spacing W is 15 micron (or above), whereas in the present invention there in no latchup at all down to a spacing of 5 micron. The holding voltage depends on the design and on the power supply voltage. The condition for preventing latchup is that the holding voltage $V_H$ needs to be larger than the power supply voltage $V_{cc}$, i.e.:

no latchup when: $V_{H>Vcc}$

Figure 8:
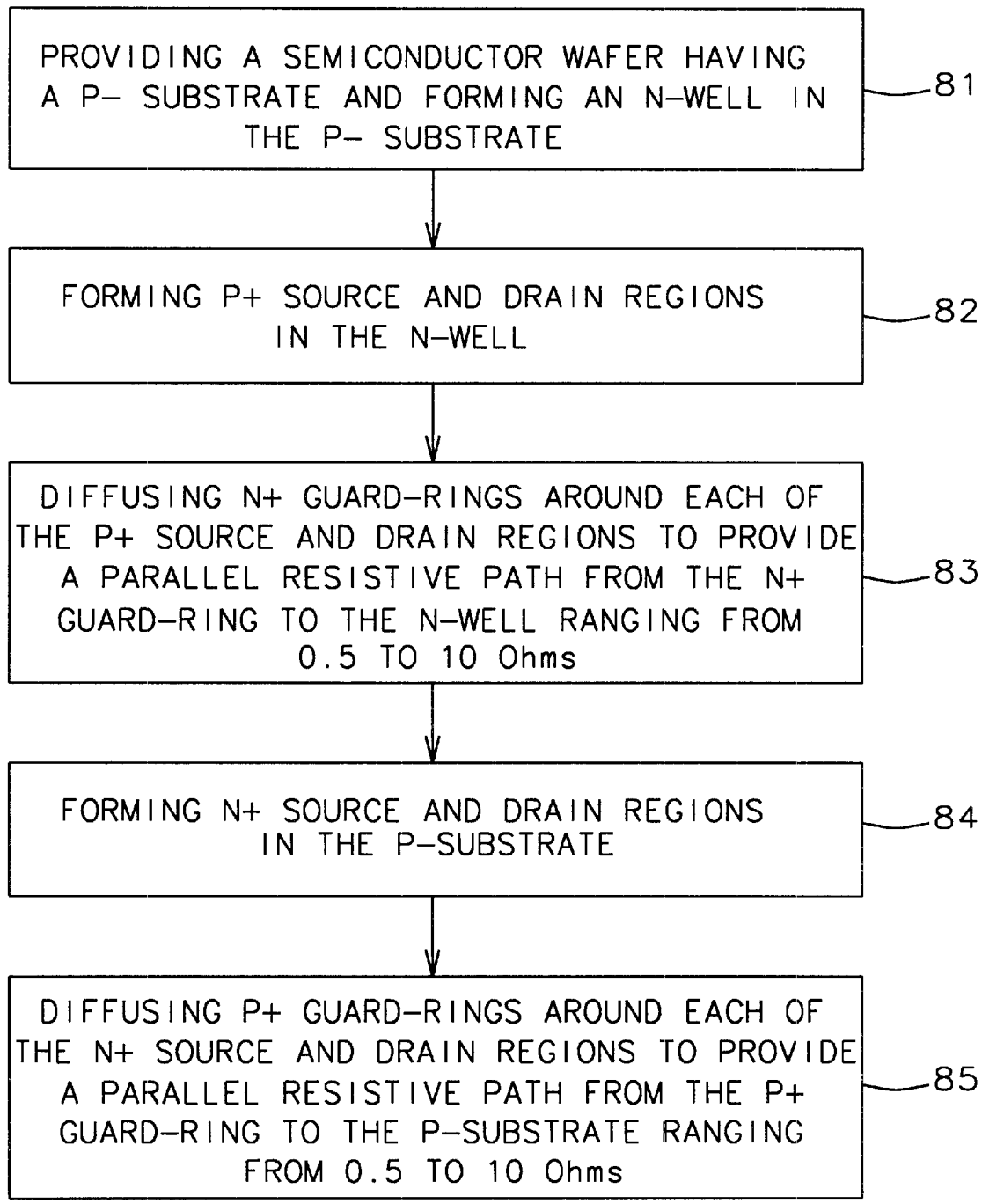
FIG. 8 is a block diagram of a first preferred method of providing a latchup-immune CMOS structure.

We now illustrate in the block diagram of FIG. 8 a first preferred method of providing a latchup-immune CMOS I/O structure, comprising the steps of:

1) providing a semiconductor wafer having a p-substrate and forming an n-well in the p-substrate, see Block 81.
2) forming p+ source and drain regions in the n-well, see Block 82.
3) diffusing n+ guard-rings around each of the p+ source and drain regions to provide a parallel resistive path to the n-well ranging from 0.5 to 10 Ohms, see Block 83.
4) forming n+ source and drain regions in the p-substrate, see Block 84.
5) diffusing p+ guard-rings around each of the n+ source and drain regions to provide a parallel resistive path to the p-substrate ranging from 0.5 to 10 Ohms, see Block 85.

The p+ source and drain regions constitute one or more p-channel transistors and the n+ source and drain regions constitute one or more n-channel transistors. N+ guard-rings are connected to a first voltage supply and p+ guard-rings are connected to a second voltage supply, where the first voltage supply is more positive than the second voltage supply. The p+ guard-rings and the n+ regions may also be formed in a p-well of the p-substrate.

Figure 9:
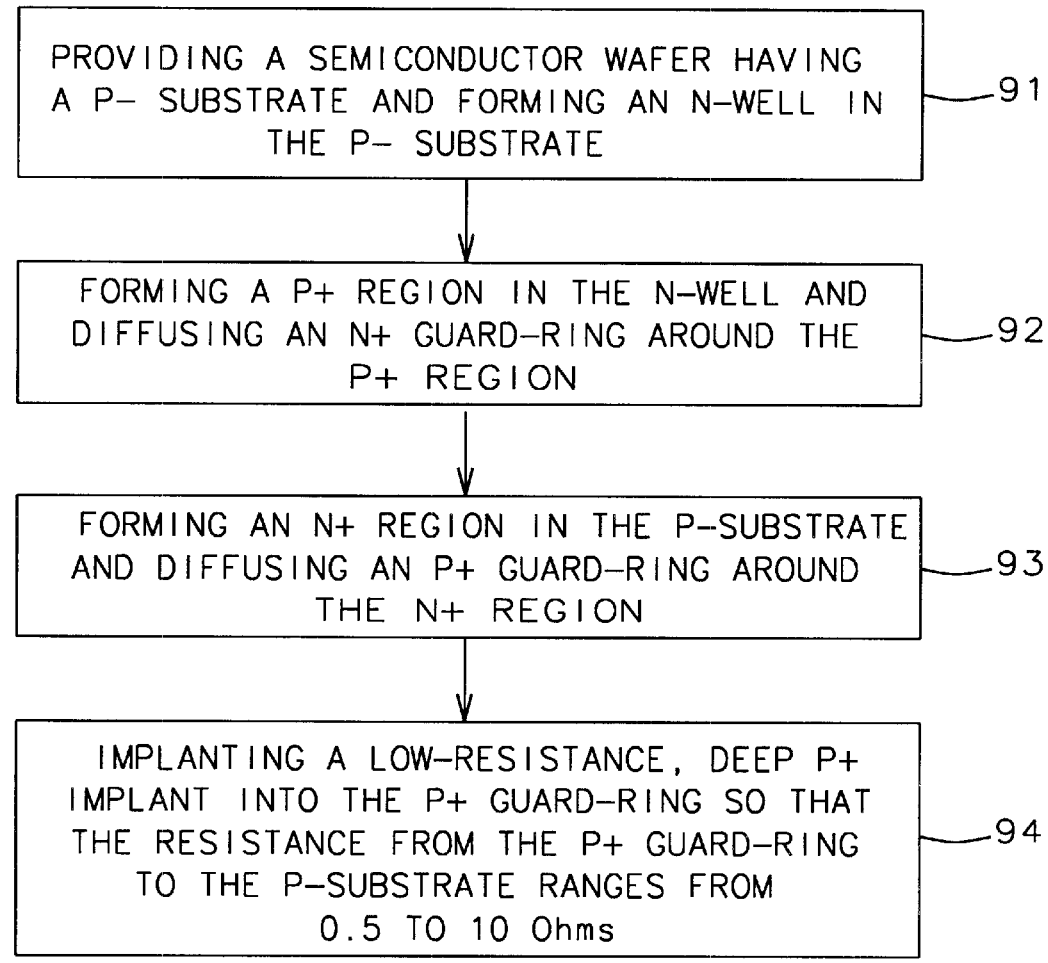
FIG. 9 is a block diagram of a second preferred method of providing a latchup-immune CMOS structure.

We now illustrate in the block diagram of FIG. 9 a second preferred method of providing a latchup-immune CMOS I/O structure, comprising the steps of:

1) providing a semiconductor wafer having a p-substrate and forming an n-well in the p-substrate, see Block 91.
2) forming a p+ region in the n-well and diffusing an n+ guard-ring around the p+ region, see Block 92.
3) forming an n+ region in the p-substrate and diffusing a p+ guard-ring around the n+ region, see Block 93.
4) implanting a low-resistance, deep p+ implant into the p+ guard-ring so that the resistance from the p+ guard-ring to the p-substrate ranges from 0.5 to 10 Ohm, see Block 94.

The n+ guard-ring is connected to a first voltage supply and the p+ guard-ring is connected to a second voltage supply, where the first voltage supply is more positive than the second voltage supply. The deep p+ implant may also be implanted into the p-well pick-up and the p+ guard-rings and the n+ regions may be located in a p-well of the p-substrate.

It is understood by those knowledgeable in the related art that all - and p-type materials mentioned in the preceding description can be replaced by p- and n-type materials, respectively, without affecting the operation of the present invention.

Advantages of the described invention are not only the increased latchup immunity but also the decrease of required NMOS and PMOS space, which imparts this invention with great economical benefits.

While the invention has been particularly shown and described with reference to the preferred embodiments thereof, it will be understood by those skilled in the art that various changes in form and details may be made without departing from the spirit and scope of the invention.

What is claimed is:

1. A method of providing a latchup-immune CMOS I/O structure, comprising the steps of:

providing a semiconductor wafer having a p-substrate;
   forming an n-well in said p-substrate;
   forming a p+ region in said n-well;
   diffusing an n+ guard-ring around said p+ region;
   forming an n+ region in said p-substrate;
   diffusing a p+ guard-ring around said n+ region; and
   implanting a deep p+ implant into said p+ guard-ring.

2. The method of claim 1, wherein said n+ guard-ring is connected to a first voltage supply.

3. The method of claim 1, wherein said p+ guard-ring is connected to a second voltage supply.

4. The method of claim 1, wherein the resistance from said p+ guard-ring to said p-substrate ranges from 0.5 to 10 Ohm.

5. The method of claim 1, wherein said deep p+ implant is implanted into a p-well pick-up.

6. The method of claim 1, wherein said p+ guard-rings and said n+ regions are located in a p-well of said p-substrate.

* * * * *